United States Patent
Yasuda et al.

(10) Patent No.: US 8,182,127 B2
(45) Date of Patent: May 22, 2012

(54) LIGHT SOURCE

(75) Inventors: Yukio Yasuda, Himeji (JP); Taku Sumitomo, Himeji (JP); Masaki Kato, Himeji (JP)

(73) Assignees: Ushio Denki Kabushiki Kaisha, Tokyo-to (JP); Energetiq Technology, Inc., Woburn, MA (US)

( * ) Notice: Subject to any disclaimer, the term of this patent is extended or adjusted under 35 U.S.C. 154(b) by 181 days.

(21) Appl. No.: 12/646,007

(22) Filed: Dec. 23, 2009

(65) Prior Publication Data

US 2010/0165656 A1 Jul. 1, 2010

(30) Foreign Application Priority Data

Dec. 27, 2008 (JP) ................................. 2008-335359

(51) Int. Cl.
*H01S 3/00* (2006.01)
*F21V 9/16* (2006.01)

(52) U.S. Cl. ........ 362/553; 362/84; 362/259; 250/493.1

(58) Field of Classification Search .................... 362/84, 362/259, 553, 554, 296.06; 250/493.1, 459.1
See application file for complete search history.

(56) References Cited

U.S. PATENT DOCUMENTS

| | | | | |
|---|---|---|---|---|
| 4,943,159 A | * | 7/1990 | Oetliker et al. | 356/73 |
| 5,606,634 A | * | 2/1997 | LeBihan | 385/31 |
| 7,672,041 B2 | * | 3/2010 | Ito | 359/332 |
| 7,683,355 B2 | * | 3/2010 | Moriya et al. | 250/504 R |
| 7,786,455 B2 | * | 8/2010 | Smith | 250/493.1 |
| 7,872,245 B2 | * | 1/2011 | Vaschenko et al. | 250/492.2 |
| 2005/0167618 A1 | * | 8/2005 | Hoshino et al. | 250/504 R |
| 2005/0213327 A1 | | 9/2005 | Kobayashi et al. | |
| 2007/0001131 A1 | | 1/2007 | Ershov et al. | |
| 2007/0228288 A1 | | 10/2007 | Smith | |
| 2007/0228300 A1 | | 10/2007 | Smith | |

FOREIGN PATENT DOCUMENTS

| | | |
|---|---|---|
| EP | 2 083 328 A1 | 7/2009 |
| JP | 61-193358 | 8/1986 |

* cited by examiner

*Primary Examiner* — Peggy A. Neils

(74) *Attorney, Agent, or Firm* — Drinker Biddle & Reath LLP

(57) ABSTRACT

A light source is provided. The light source includes: an elliptical reflection mirror having first and second focal points; a discharge chamber in which a luminescent substance is enclosed and which is disposed on the first focal point; a laser light generator which emits the laser light; and a laser light guide which guides the laser light from an opening side of the elliptical reflection mirror into the discharge chamber. The luminescent substance is excited by providing the laser light to the luminescent substance so as to emit light, and the light is reflected by the elliptical reflection mirror. The laser light guide is disposed in a shade area in which the light reflected by the elliptical reflection mirror is blocked by the discharge chamber.

13 Claims, 10 Drawing Sheets

LIGHT SOURCE

This application claims priority from Japanese Patent Application No. 2008-33 5359, filed on Dec. 27, 2008, the entire contents of which are hereby incorporated by reference.

BACKGROUND OF THE INVENTION

1. Technical Field

The present disclosure relates to a light source. More particularly, the present disclosure relates to a light source that is installed in an exposure apparatus which is used in processes of manufacturing a semiconductor, a liquid crystal substrate, a color filter, and the like.

2. Related Art

In the processes of manufacturing the semiconductors, the liquid crystal substrate, the color filter, and the like, a decrease in process time and one-shot exposure of an object to be processed which has a large area has been required. In order to cope with this requirement, a high-pressure discharge lamp has been proposed in which a larger ultraviolet radiation intensity can be obtained by applying a higher input electric power.

The input electric power to the high-pressure discharge lamp may be set to be high. In this case, problems arise in that the load to the electrodes increases and substances evaporated from the electrodes cause the high-pressure lamp to become dark and shorten the lifetime of the lamp.

FIG. 16 is a diagram illustrating a light source disclosed in JP-A-61-193358.

As shown in the drawing, in order to solve the above problems, a light source 100 is configured as follows. An electrodeless discharge chamber 104 is disposed inside an elliptical reflection mirror 101. Through a hole 102 that is provided on the side surface of the elliptical reflection mirror 101, laser light enters the discharge chamber 104, and a discharge gas enclosed in the discharge chamber is excited, so that light is emitted. According to the light source 100, it is possible to solve the above problems since electrodes are not provided in the discharge chamber 104.

However, in the light source 100 disclosed in JP-A-61-193358, the hole 102 for light incidence of the laser light and a hole 103 for light exit of the laser light are provided on the side surfaces of the elliptical reflection mirror 101. Since the holes 102 and 103 are provided on a reflective surface of the elliptical reflection mirror 101, when ultraviolet light emitted from the electrodeless discharge chamber 104 is collected by the elliptical reflection mirror 101, there is a problem in that it is very difficult to utilize the ultraviolet light efficiently. Further, since the laser light enters the electrodeless discharge chamber 104 in a direction intersecting an optical axis X of the elliptical reflection mirror 101, the discharge is extended in a horizontal direction (the direction intersecting the optical axis X), and thus is generated in a region deviating from a focal point of the elliptical reflection mirror 101. Thus, the ultraviolet light is not accurately reflected. As a result, the problem arises in that it is difficult to utilize the ultraviolet light efficiently.

Meanwhile, FIG. 17 is a diagram illustrating a light source disclosed in U.S. Patent Application Pub. US2007/0228300.

As shown in the drawing, in order to solve the above-mentioned problem, a light source 200 is configured as follows. An electrodeless discharge lamp is disposed in a reflection mirror 201. Through an opening 202 that is provided on the top of the reflection mirror 201, laser light enters a discharge chamber 203 of the discharge lamp, and a discharge gas enclosed in the discharge chamber 203 is excited, so that light is emitted. By using the light source 200, it is possible to solve the problems since electrodes are not provided in the discharge lamp.

However, also in the light source 200 disclosed in US2007/0228300, the laser light enters (passes) the reflection mirror 201 through the top opening 202 of the reflection mirror 201, and is irradiated to the discharge chamber 203, so that discharge 204 is generated. However, a part of the laser light passes through the discharge 204 and the discharge chamber 203, and thus the laser light is irradiated onto a surface to be irradiated together with light emitted from the discharge. Therefore, the laser light gives damage to a surface of an object to be processed.

FIGS. 18 and 19 are diagrams illustrating configurations for solving the above-mentioned problems of the light source 200 disclosed in US2007/0228300.

In the configuration shown in FIG. 18, the laser light, which passes through the opening for light exit from the reflection mirror 205, is reflected by the reflection mirror 206, and is irradiated into the reflection mirror 205. Thus, the discharge gas filled in the reflection mirror 205 is excited, so that discharge is generated. Light emitted by the discharge passes through the reflection mirror 206 and is output to the outside. Further, in the configuration shown in FIG. 19, the laser light, which passes through the opening for light exit from the reflection mirror 205, passes through the reflection mirror 208, and is irradiated into the reflection mirror 205. Thus, the discharge gas filled in the reflection mirror 205 is excited, so that discharge is generated. Light emitted by the discharge is reflected by the reflection mirror 208 and is output to the outside.

According to the configurations shown in FIGS. 18 and 19, it is possible to solve the above-mentioned problems of the light source shown in FIG. 17. However, in the configurations of FIGS. 18 and 19, the reflection mirrors 206 and 208 are required to have a function of wavelength selectivity, but it is difficult to manufacture them. Also, the mirrors might select wavelengths inaccurately. Additionally, in the case of the reflection mirror 206, a part of the emitted light is absorbed by the reflection mirror 206, and, similarly in the case of the reflection mirror 208, a part of the emitted light is absorbed by the reflection mirror 208. Therefore, there is a problem in that it is difficult to use the emitted light efficiently.

SUMMARY OF THE INVENTION

Accordingly, in light sources that emit light from the discharge chamber by providing laser light to the discharge chamber, it is an illustrative aspect of the present invention to provide a light source in which light emitted from the discharge chamber is reliably reflected by the elliptical reflective surface and the reflected light is used efficiently. The above light source can be made in such a manner that the laser light is guided to the shade area where the reflection light reflected by the elliptical reflection mirror is blocked by the discharge chamber.

According to one or more illustrative aspects of the present invention, there is provided a light source is provided. The light source includes: an elliptical reflection mirror having first and second focal points; a discharge chamber in which a luminescent substance is enclosed and which is disposed on the first focal point; a laser light generator which emits the laser light; and a laser light guide which guides the laser light from an opening side of the elliptical reflection mirror into the discharge chamber. The luminescent substance is excited by providing the laser light to the luminescent substance so as to emit light, and the light is reflected by the elliptical reflection mirror. The laser light guide is disposed in a shade area in which the light reflected by the elliptical reflection mirror is blocked by the discharge chamber.

Other aspects of the invention will be apparent from the following description, the drawings and the claims.

DETAILED DESCRIPTION OF EXEMPLARY EMBODIMENTS

Exemplary embodiments of the present invention will be now described with reference to the drawings.

A first exemplary embodiment of the present invention will be described with reference to FIG. 1.

Figure 1:
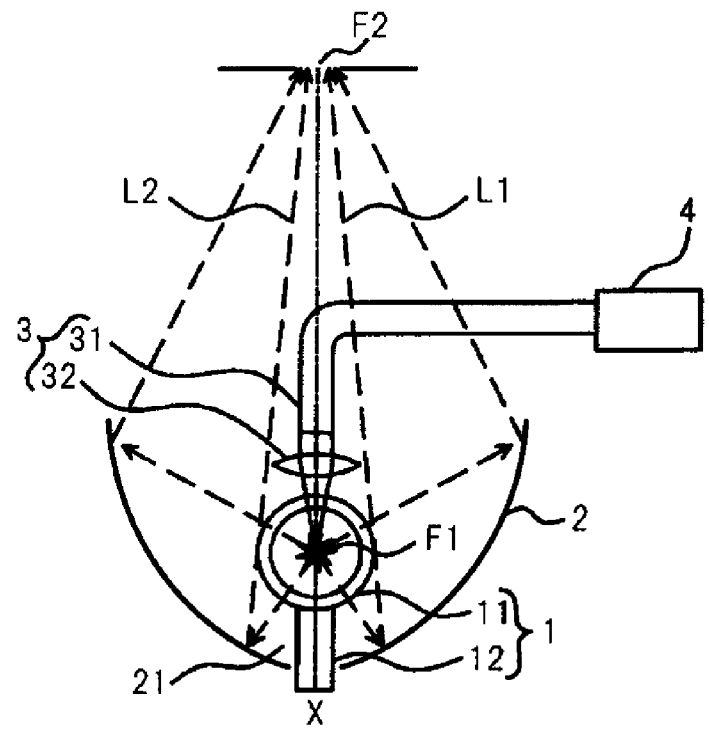
FIG. 1 is a diagram illustrating a configuration of a light source according to a first exemplary embodiment of the invention.

FIG. 1 is a diagram illustrating a configuration of a light source according to the exemplary embodiment of the present invention.

As shown in the drawing, a discharge chamber 1 may be made of quartz glass, and includes a light-emitting portion 11 and a sealing portion 12. In the light-emitting portion 11, for example, mercury of about 4.5 mg/cm$^3$ and Xenon of about 2 atmospheres are enclosed as luminescent substances. The discharge chamber 1 is an electrodeless discharge chamber having no electrode. An elliptical reflection mirror 2 has a top opening 21. The sealing portion 12 of the discharge chamber 1 is inserted into the top opening 21. The sealing portion 12 is supported at the rear position of the elliptical reflection mirror 2. The discharge chamber 1 is disposed on a focal point F1 of the elliptical reflection mirror 2. Outside the elliptical reflection mirror 2, a laser light generator 4 is provided. Laser light, which is produced from the laser light generator 4 may be a CW (Continuous Wave) laser or a pulse laser of about 20 kHz. The laser light is guided to the discharge chamber 1 by a laser light guide 3.

Boundary lines L1 and L2 are tangent lines which are tangent to the discharge chamber 1 and pass through the other focal point F2 of the elliptical reflection mirror 2. In a region formed between the boundary line L1 and the boundary line L2, a part of the reflection light reflected by the elliptical reflection mirror 2 is blocked by the discharge chamber 1.

This region is referred to as a shade area L1-L2 hereinafter. The laser light guide 3 includes: an optical fiber 31 that guides the laser light, which is emitted from the laser light generator 4, into the discharge chamber 1; and a collecting lens 32 that is disposed between the output end of the optical fiber 31 and the discharge chamber 1. The laser light guide 3 is provided in the shade area L1-L2. The laser light is collected by the collecting lens 32 and is irradiated into the discharge chamber 1. By collecting the laser light, it is possible to increase energy density at the focus point, and it is possible to excite the luminescent substances and emit light.

According to the exemplary embodiment of the invention, the optical fiber 31 and the collecting lens 32 serving as the laser light guide 3 are provided in the shade area L1-L2. Therefore, without blocking the reflection light reflected by the elliptical reflection minor 2, it is possible to use the reflection light efficiently. Further, the collected laser light is guided by the laser light guide 3 from the opening side of the elliptical reflection mirror 2 into the discharge chamber 1. Therefore, a surface of an object to be processed is not directly irradiated with laser light, and thus it is possible to prevent the object from being damaged by the laser light. Further, since the laser light travels along the optical axis X of the elliptical reflection mirror 2, the discharge produced in the discharge chamber 1 is extended in the direction of the optical axis X. Therefore, a ratio of the emitted light that is captured by the elliptical reflection minor 2 becomes high, and thus it is possible to use the emitted light efficiently.

A second exemplary embodiment of the present invention will be described with reference to FIG. 2.

Figure 2:
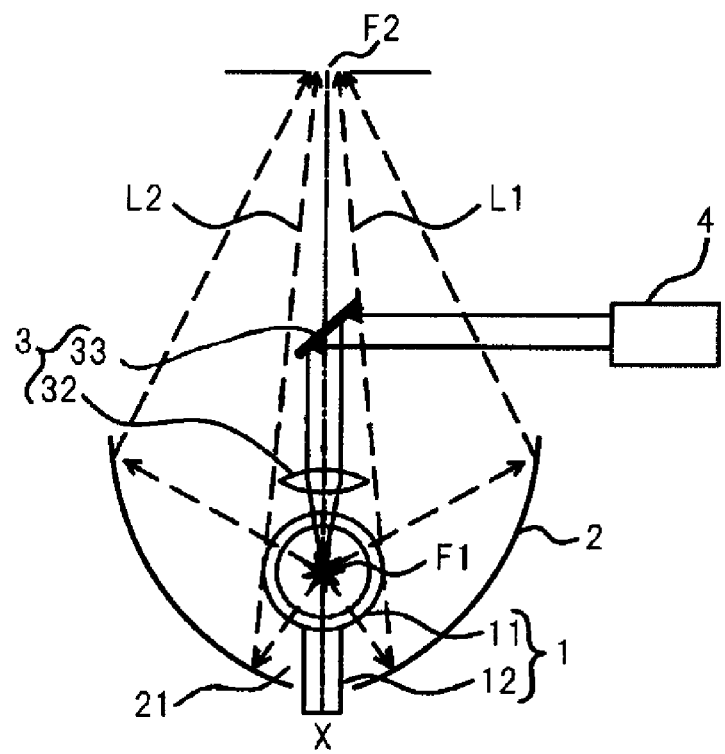
FIG. 2 is a diagram illustrating a configuration of a light source according to a second exemplary embodiment of the invention.

FIG. 2 is a diagram illustrating a configuration of a light source according to the exemplary embodiment of the invention.

As shown in the drawing, the laser light guide 3 includes: a reflection mirror 33 that reflects the laser light, which is emitted from the laser light generator 4, toward the discharge chamber 1; and the collecting lens 32 that is disposed between the reflection mirror 33 and the discharge chamber 1. The laser light guide 3 is provided in the shade area L1-L2. The laser light, which is reflected and guided by the reflection mirror 33, is collected by the collecting lens 32 and is irradiated into the discharge chamber 1. Therefore, it is possible to increase energy density at the focus point, and it is possible to excite the luminescent substances and emit light. Furthermore, the other components correspond to the components denoted by the same reference numerals and signs shown in FIG. 1.

According to the exemplary embodiment of the invention, the reflection mirror 33 and the collecting lens 32 serving as the laser light guide 3 are provided in the shade area L1-L2. Therefore, without blocking the reflection light reflected by the elliptical reflection mirror 2, it is possible to use the reflection light efficiently. Further, the collected laser light is guided by the laser light guide 3 from the opening side of the elliptical reflection mirror 2 into the discharge chamber 1. Therefore, a surface of an object to be processed is not directly irradiated with laser light, and thus it is possible to prevent the object from being damaged by the laser light. Further, since the laser light travels along the optical axis X of the elliptical reflection mirror 2, the discharge produced in the discharge chamber 1 is extended in the direction of the optical axis X. Therefore, a ratio of the emitted light that is captured by the elliptical reflection mirror 2 becomes high, and it is possible to use the emitted light efficiently.

A third exemplary embodiment of the invention will be described with reference to FIG. 3.

Figure 3:
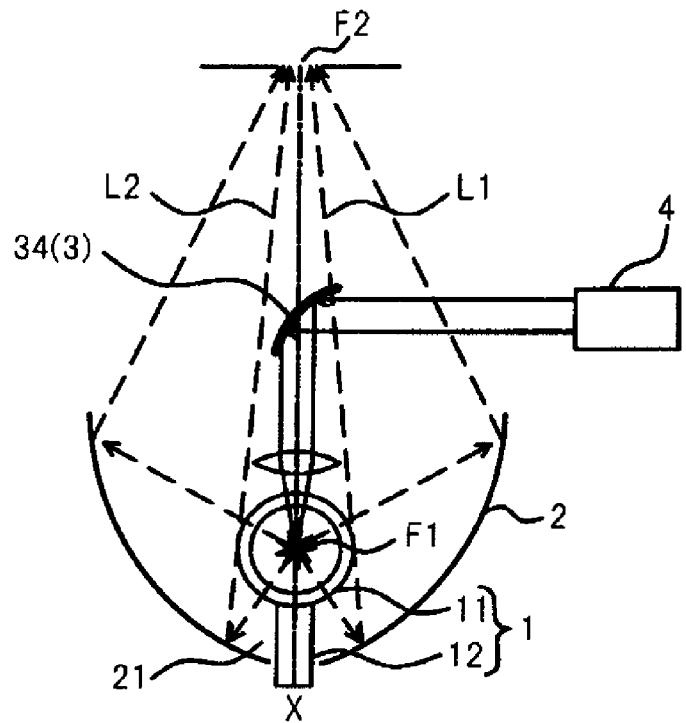
FIG. 3 is a diagram illustrating a configuration of a light source according to a third exemplary embodiment of the invention.

FIG. 3 is a diagram illustrating a configuration of a light source according to the exemplary embodiment of the invention.

As shown in the drawing, the laser light guide 3 includes: a collecting mirror 34 that collects and reflects the laser light, which is emitted from the laser light generator 4, toward the discharge chamber 1. The laser light guide 3 is provided in the shade area L1-L2. The laser light, which is collected and reflected by the collecting mirror 34, is irradiated into the discharge chamber 1. By collecting the laser light, it is possible to increase energy density at the focus point, and it is possible to excite the luminescent substances and emit light. Furthermore, the other components correspond to the components denoted by the same reference numerals and signs shown in FIG. 1.

According to the exemplary embodiment of the invention, the collecting mirror 34 serving as the laser light guide 3 is provided in the shade area L1-L2. Therefore, without blocking the reflection light reflected by the elliptical reflection mirror 2, it is possible to use the reflection light efficiently. Further, the laser light collected by the laser light guide 3 is guided from the opening side of the elliptical reflection mirror 2 into the discharge chamber 1. Therefore, a surface of an object to be processed is not directly irradiated with laser light, and thus it is possible to prevent the object from being damaged by the laser light. Further, since the laser light travels along the optical axis X of the elliptical reflection mirror 2, the discharge produced in the discharge chamber 1 is extended in the direction of the optical axis X. Therefore, a ratio of the emitted light that is captured by the elliptical reflection mirror 2 becomes high, and it is possible to use the emitted light efficiently.

A fourth exemplary embodiment of the invention will be described with reference to FIG. 4.

Figure 4:
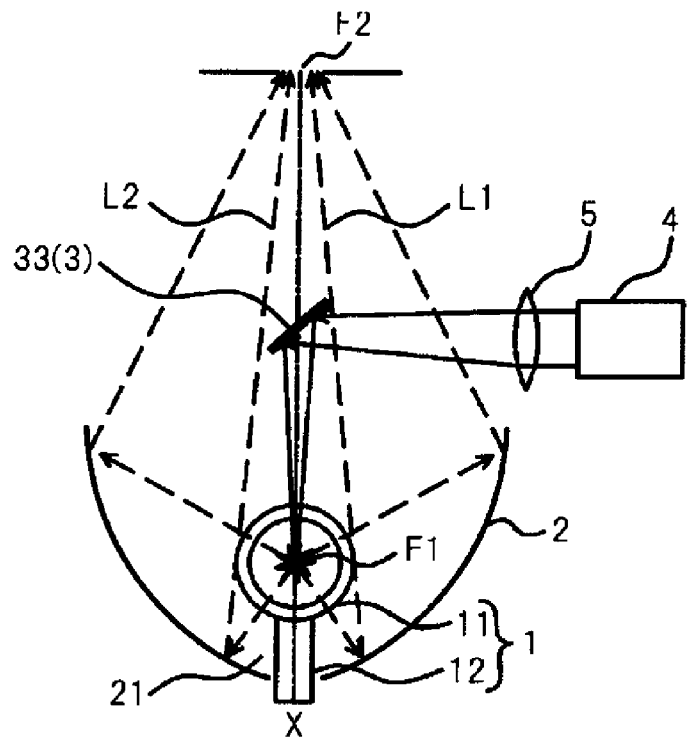
FIG. 4 is a diagram illustrating a configuration of a light source according to a fourth exemplary embodiment of the invention.

FIG. 4 is a diagram illustrating a configuration of a light source according to the exemplary embodiment of the invention.

As shown in the drawing, the laser light guide 3 includes: a collecting lens 5 that collects the laser light, which is emitted from the laser light generator 4; and the reflection mirror 33 that reflects the laser light, which is collected by the collecting lens 5, toward the discharge chamber 1. The laser light guide 3 is provided in the shade area L1-L2. The laser light, which is collected and reflected by the reflection mirror 33, is irradiated into the discharge chamber 1. By collecting the laser light, it is possible to increase energy density at the focus point, and it is possible to excite the luminescent substances and emit light. Furthermore, the other components correspond to the components denoted by the same reference numerals and signs shown in FIG. 1.

According to the exemplary embodiment of the invention, the reflection mirror 33 serving as the laser light guide 3 is provided in the shade area L1-L2. Therefore, without blocking the reflection light reflected by the elliptical reflection mirror 2, it is possible to use the reflection light efficiently Further, the laser light collected by the laser light guide 3 is guided from the opening side of the elliptical reflection mirror 2 into the discharge chamber 1. Therefore, a surface of an object to be processed is not directly irradiated with laser light, and thus it is possible to prevent the object from being damaged by the laser light. Further, since the laser light travels along the optical axis X of the elliptical reflection mirror 2, the discharge produced in the discharge chamber 1 is extended in the direction of the optical axis X. Therefore, a ratio of the emitted light that is captured by the elliptical reflection mirror 2 becomes high, and it is possible to use the emitted light efficiently.

A fifth exemplary embodiment of the invention will be described with reference to FIG. 5.

Figure 5:
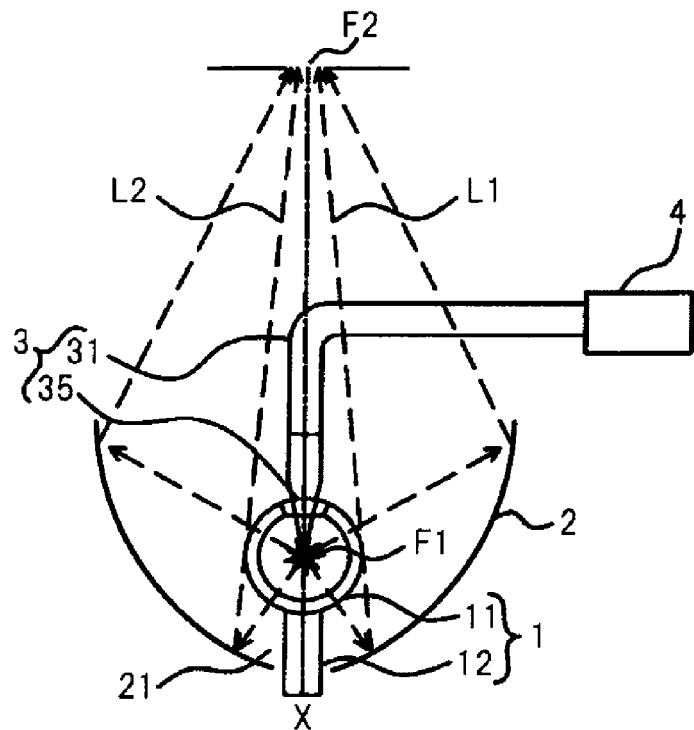
FIG. 5 is a diagram illustrating a configuration of a light source according to a fifth exemplary embodiment of the invention.

FIG. 5 is a diagram illustrating a configuration of a light source according to the exemplary embodiment of the invention.

As shown in the drawing, the laser light guide 3 includes: the optical fiber 31 that guides the laser light, which is emitted from the laser light generator 4, into the discharge chamber 1; and a collecting lens portion 35 that is formed on a portion of the discharge chamber 1 so as to collect the laser light output from the optical fiber 31. The laser light guide 3 is provided in the shade area L1-L2. The laser light is collected by the collecting lens portion 35 and is guided and irradiated into the discharge chamber 1. Therefore, it is possible to increase energy density at the focus point, and it is possible to excite the luminescent substances and emit light. Furthermore, the other components correspond to the components denoted by the same reference numerals and signs shown in FIG. 1.

According to the exemplary embodiment of the invention, the laser light guide 3 includes: the optical fiber 31 that guides the laser light, which is emitted from the laser light generator 4, into the discharge chamber 1; and the collecting lens portion 35 that is formed on a portion of the discharge chamber 1 so as to collect the laser light output from the optical fiber 31, and is provided in the shade area L1-L2. Therefore, without blocking the reflection light reflected by the elliptical reflection mirror 2, it is possible to use the reflection light efficiently. Further, the laser light collected by the laser light guide 3 is guided from the opening side of the elliptical reflection mirror 2 into the discharge chamber 1. Therefore, a surface of an object to be processed is not directly irradiated with laser light, and thus it is possible to prevent the object from being damaged by the laser light. Further, since the laser light travels along the optical axis X of the elliptical reflection mirror 2, the discharge produced in the discharge chamber 1 is extended in the direction of the optical axis X. Therefore, a ratio of the emitted light that is captured by the elliptical reflection mirror 2 becomes high, and it is possible to use the emitted light efficiently.

A sixth exemplary embodiment of the invention will be described with reference to FIG. 6.

Figure 6:
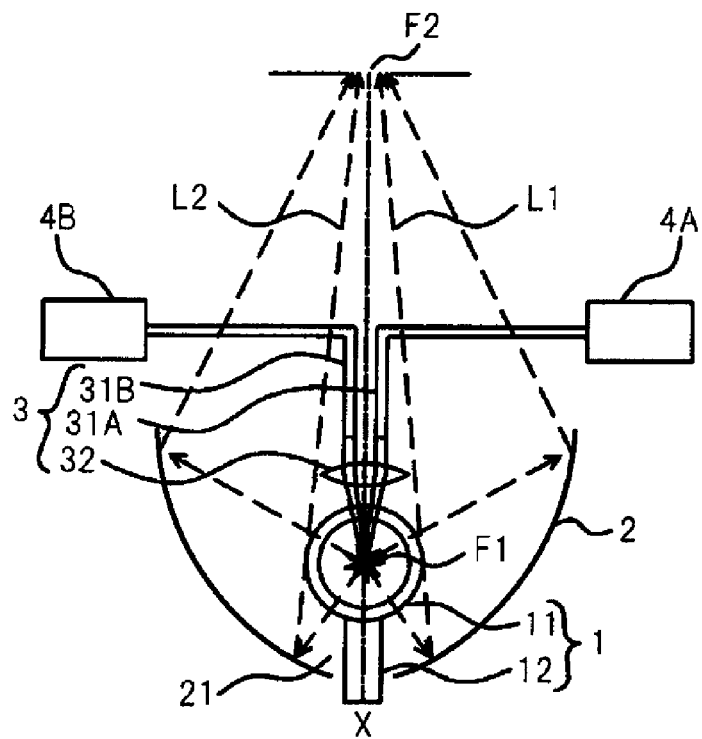
FIG. 6 is a diagram illustrating a configuration of a light source according to a sixth exemplary embodiment of the invention.

FIG. 6 is a diagram illustrating a configuration of a light source according to the exemplary embodiment of the invention.

As shown in the drawing, the laser light guide 3 includes: an optical fiber 31A that guides laser light A, which is emitted from the laser light generator 4A; an optical fiber 31B that guides laser light B, which is emitted from the laser light generator 4B; and the collecting lens 32 that is disposed between the discharge chamber 1 and output ends of the optical fiber 31A and the optical fiber 31B. The laser light guide 3 is provided in the shade area L1-L2. The laser light A is a CW laser light for maintaining discharge. The laser light B is a pulse (e.g., 20 kHz) laser light for starting discharge. By overlapping the laser light B with the laser light A, it is possible to promote excitation of a luminescent substance within the discharge chamber 1, and it is also possible to reliably produce discharge as compared with the case where only the laser light A is used. Furthermore, after stabilization of the discharge, the laser light B is turned off. Further, the timing of applying the laser light A and the laser light B may be the same, and may be sequential. In addition, both of the laser light A and the laser light B may be an pulse laser light. Further, the other configurations and advantages of the exemplary embodiment are the same as those of the first exemplary embodiment, and thus description thereof will be omitted herein.

A seventh exemplary embodiment of the invention will be described with reference to FIG. 7.

Figure 7:
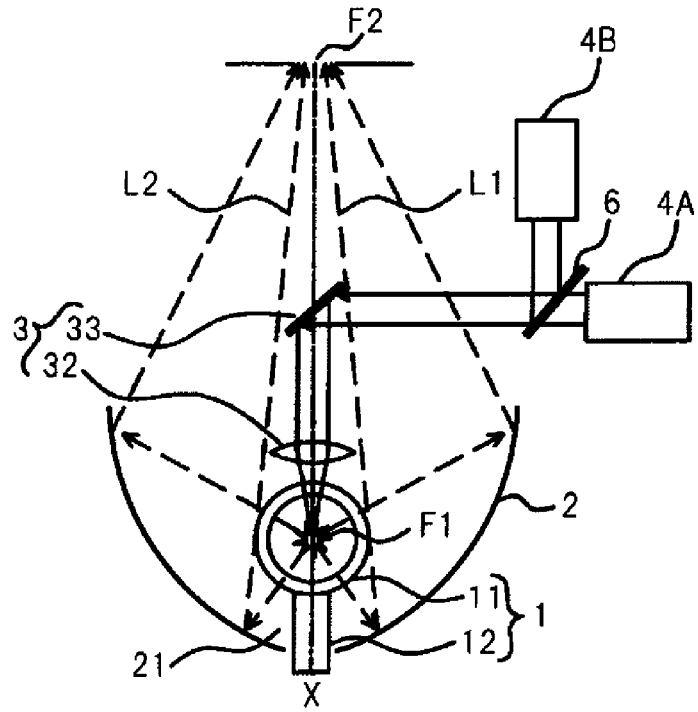
FIG. 7 is a diagram illustrating a configuration of a light source according to a seventh exemplary embodiment of the invention.

FIG. 7 is a diagram illustrating a configuration of a light source according to the exemplary embodiment of the invention.

As shown in the drawing, the laser light guide 3 includes: the reflection mirror 33 that reflects the laser light A, which is emitted from the laser light generator 4A and passes through a reflection mirror 6, and the laser light B, which is emitted from the laser light generator 4B and is reflected by the reflection mirror 6, toward the discharge chamber 1; and the collecting lens 32 that is disposed between the reflection mirror 33 and the discharge chamber 1. The laser light guide 3 is provided in the shade area L1-L2. The laser light A is a CW laser light for maintaining discharge and the laser light B is a pulse laser light for starting discharge. By overlapping the laser light B with the laser light A, it is possible to promote excitation of a luminescent substance within the discharge chamber 1, and it is also possible to reliably generate discharge as compared with the case where only the laser light A is used. Furthermore, after stabilization of the discharge, the laser light B is turned off. Further, the timing of applying the laser light A and the laser light B may be the same, or may be sequential. In addition, both of the laser light A and the laser light B may be a pulse laser. Further, the other configurations and advantages of the exemplary embodiment are the same as those of the second exemplary embodiment, and thus description thereof will be omitted herein.

An eighth exemplary embodiment of the invention will be described with reference to FIG. 8.

Figure 8:
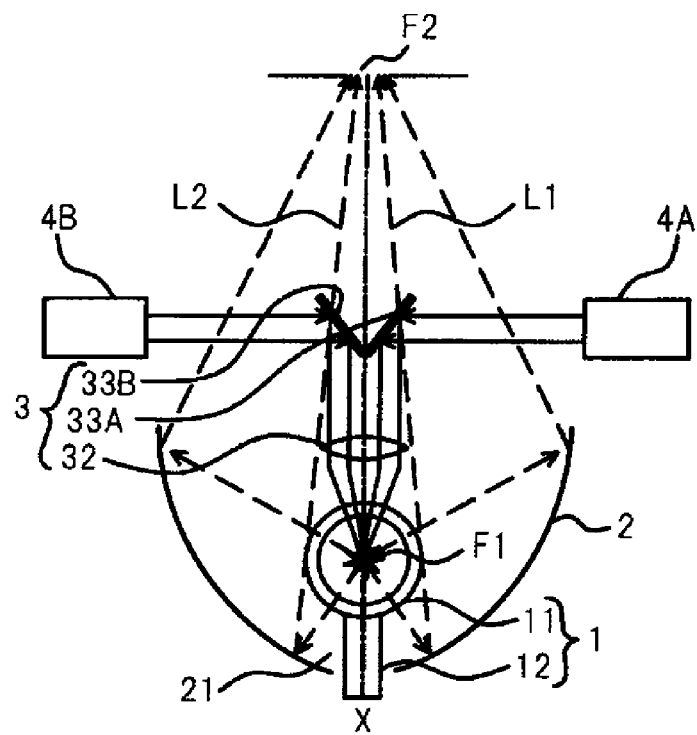
FIG. 8 is a diagram illustrating a configuration of a light source according to an eighth exemplary embodiment of the invention.

FIG. 8 is a diagram illustrating a configuration of a light source according to the exemplary embodiment of the invention.

As shown in the drawing, the laser light guide 3 includes: a reflection mirror 33A that reflects the laser light A, which is emitted from the laser light generator 4A, toward the discharge chamber 1; the reflection mirror 33B that reflects the laser light B, which is emitted from the laser light generator 4B, toward the discharge chamber 1; and the collecting lens 32 that is disposed between the discharge chamber 1 and the reflection mirrors 33A and 33B. The laser light guide 3 is provided in the shade area L1-L2. The laser light A is a CW laser light for maintaining discharge, and the laser light B is a pulse laser light for starting discharge. By overlapping the laser light B with the laser light A, it is possible to promote excitation of a luminescent substance within the discharge chamber 1, and it is also possible to reliably generate discharge as compared with the case where only the laser light A is used. Furthermore, after stabilization of the discharge, the laser light B is turned off. Further, the timing of applying the laser light A and the laser light B may be the same, or may be sequential. In addition, but both of the laser light A and the laser light B may be a pulse laser. Further, the other configurations and advantages of the exemplary embodiment are the same as those of the second exemplary embodiment, and thus description thereof will be omitted herein.

A ninth exemplary embodiment of the invention will be described with reference to FIG. 9.

Figure 9:
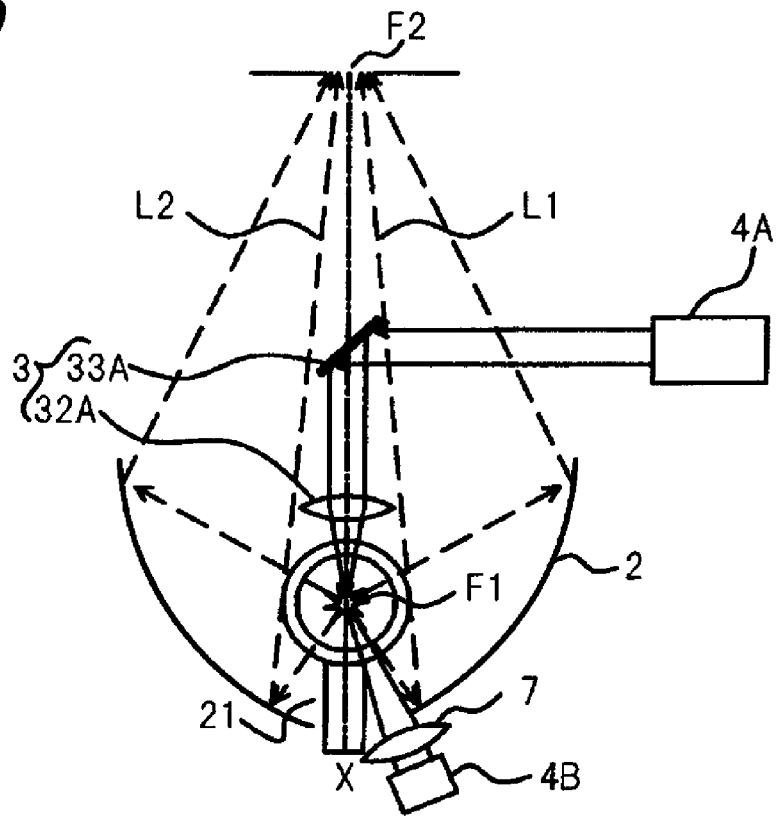
FIG. 9 is a diagram illustrating a configuration of a light source according to a ninth exemplary embodiment of the invention.

FIG. 9 is a diagram illustrating a configuration of a light source according to the exemplary embodiment of the invention.

As shown in the drawing, the laser light guide 3 includes: the reflection mirror 33A that reflects the laser light A, which is emitted from the laser light generator 4A, toward the discharge chamber 1; and the collecting lens 32A that is disposed between the discharge chamber 1 and the reflection mirror 33A. The laser light guide 3 is provided in the shade area L1-L2. Meanwhile, the laser light B, which is emitted from the laser light generator 4B provided near the top opening 21 of the elliptical reflection mirror 2, is collected by a collecting lens 7 and is irradiated into the discharge chamber 1. The laser light A is a CW laser light for maintaining discharge, and the laser light B is a pulse laser light for starting discharge. By overlapping the laser light B with the laser light A, it is possible to promote excitation of a luminescent substance within the discharge chamber 1, and it is also possible to reliably generate discharge as compared with the case where only the laser light A is used. Furthermore, after stabilization of the discharge, the laser light B is turned off. Further, the timing of applying the laser light A and the laser light B may be the same, or may be sequential. In addition, both of the laser light A and the laser light B may be a pulse laser. Further, the other configurations and advantages of the exemplary embodiment are the same as those of the second exemplary embodiment, and thus description thereof will be omitted herein.

A tenth exemplary embodiment of the invention will be described with reference to FIG. 10.

Figure 10:
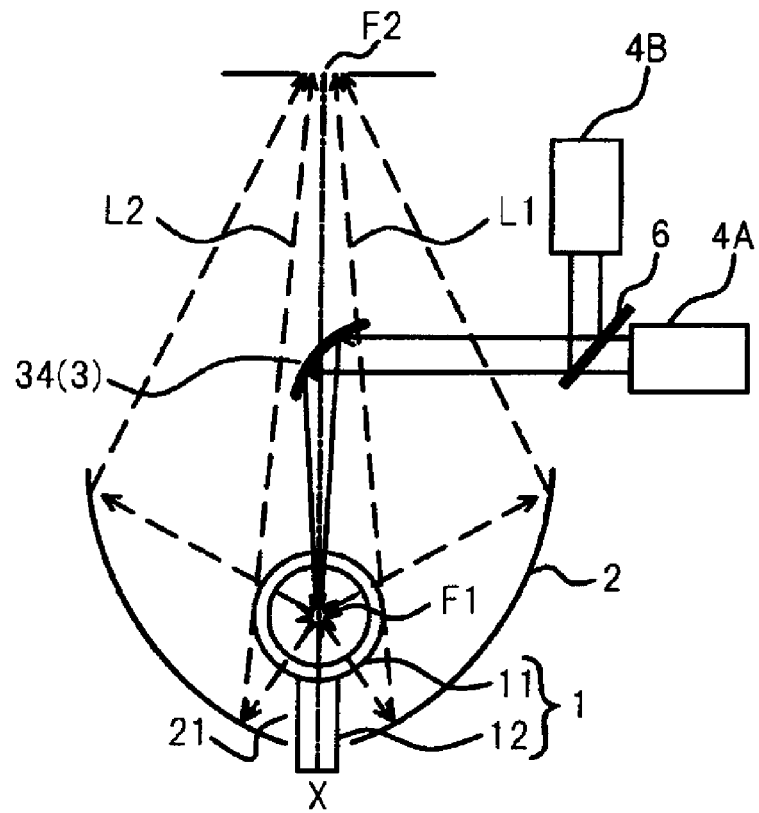
FIG. 10 is a diagram illustrating a configuration of a light source according to a tenth exemplary embodiment of the invention.

FIG. 10 is a diagram illustrating a configuration of a light source according to the exemplary embodiment of the invention.

As shown in the drawing, the laser light guide 3 includes: the collecting mirror 34 that collects and reflects the laser light A, which is emitted from the light generator 4A and passes through the reflection mirror 6, and the laser light B, which is emitted from the laser light generator 4B and is reflected by the reflection mirror 6, toward the discharge chamber 1. The laser light guide 3 is provided in the shade area L1-L2. The laser light A is a CW laser light for maintaining discharge, and the laser light B is a pulse laser light for starting discharge. By overlapping the laser light B with the laser light A, it is possible to promote excitation of a luminescent substance within the discharge chamber 1, and it is also possible to reliably generate discharge as compared with the case where only the laser light A is used. Furthermore, after stabilization of the discharge, the laser light B is turned off. Further, the timing of applying the laser light A and the laser light B may be the same, or may be sequential. In addition, both of the laser light A and the laser light B may be a pulse laser. Further, the other configurations and advantages of the exemplary embodiment are the same as those of the third exemplary embodiment, and thus description thereof will be omitted herein.

An eleventh exemplary embodiment of the invention will be described with reference to FIG. 11.

Figure 11:
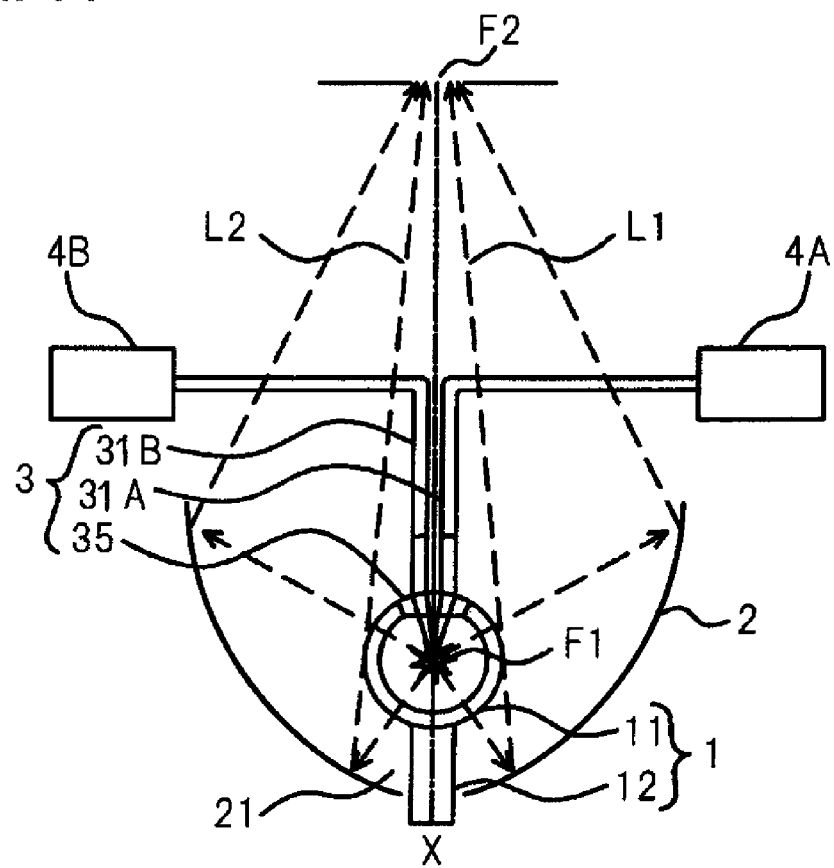
FIG. 11 is a diagram illustrating a configuration of a light source according to an eleventh exemplary embodiment of the invention.

FIG. 11 is a diagram illustrating a configuration of a light source according to the exemplary embodiment of the invention.

As shown in the drawing, the laser light guide 3 includes: the optical fiber 31A that guides the laser light A, which is emitted from the laser light generator 4A; the optical fiber 31B that guides the laser light B, which is emitted from the laser light generator 4B; and the collecting lens portion 35 that is formed on a portion of the discharge chamber 1 so as to collect the laser light A and the laser light B which are output from the optical fibers 31A and 31B. The laser light guide 3 is provided in the shade area L1-L2. The laser light A is a CW laser light for maintaining discharge, and the laser light B is a pulse laser light for starting discharge. By overlapping the laser light B with the laser light A, it is possible to promote excitation of a luminescent substance within the discharge chamber 1, and it is also possible to reliably generate discharge as compared with the case where only the laser light A is used. Furthermore, after stabilization of the discharge, the laser light B is turned off. Further, the timing of applying the laser light A and the laser light B may be the same, or may be sequential. In addition, both of the laser light A and the laser light B may be a pulse laser. Further, the other configurations and advantages of the exemplary embodiment are the same as those of the first exemplary embodiment, and thus description thereof will be omitted herein.

Figure 12:
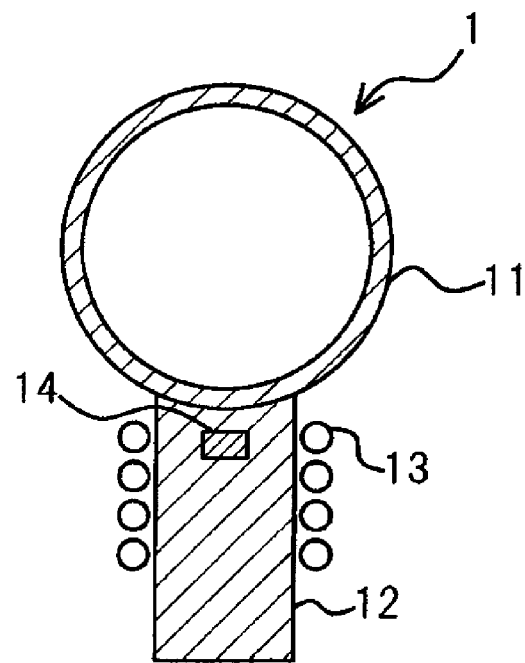
FIG. 12 is a diagram illustrating a specific configuration of the discharge chamber 1 according to the first to fourth and sixth to tenth exemplary embodiments.

FIG. 12 is a diagram illustrating a specific configuration of the discharge chamber 1 according to the first to fourth and sixth to tenth exemplary embodiments.

As shown in the drawing, the discharge chamber 1 is an electrodeless discharge chamber having no electrode in the discharge chamber 1, and the sealing portion 12 of the discharge chamber 1 is provided with a heater 13 that is the heating unit and a heating element 14 that generates heat by absorbing the laser light. The heating element 14 may be formed of pure carbon, carbon mixture, aluminum, metals or ceramics on which iron(III) oxide is coated. Further, any one of the heater 13 and the heating element 14 may be used. By providing the heating unit to the discharge chamber 1, it is possible to increase a temperature of the discharge chamber 1, and thus it is possible to promote excitation of the luminescent substance.

Figure 13:
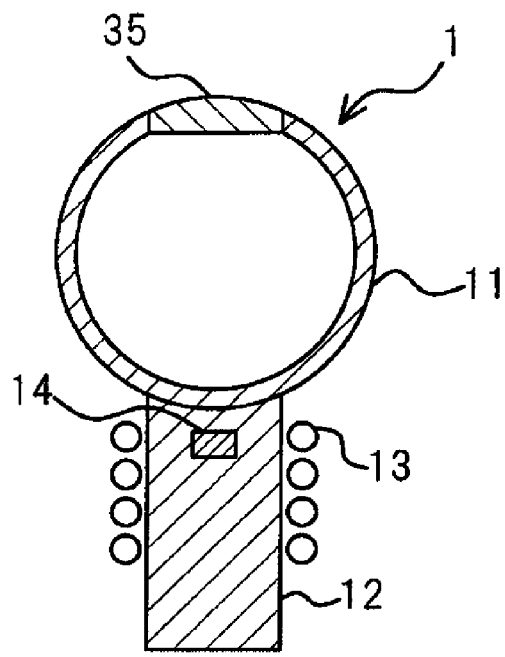
FIG. 13 is a diagram illustrating a specific configuration of the discharge chamber 1 according to the fifth and eleventh exemplary embodiments.

FIG. 13 is a diagram illustrating a specific configuration of the discharge chamber 1 according to the fifth and eleventh exemplary embodiments.

As shown in the drawing, the discharge chamber 1 is provided with the collecting lens portion 35 that is formed on a portion of the discharge chamber 1 so as to collect the laser light. Further, the other configurations and advantages are the same as those of the discharge chamber 1 described in FIG. 12, and thus description thereof will be omitted herein.

Figure 14:
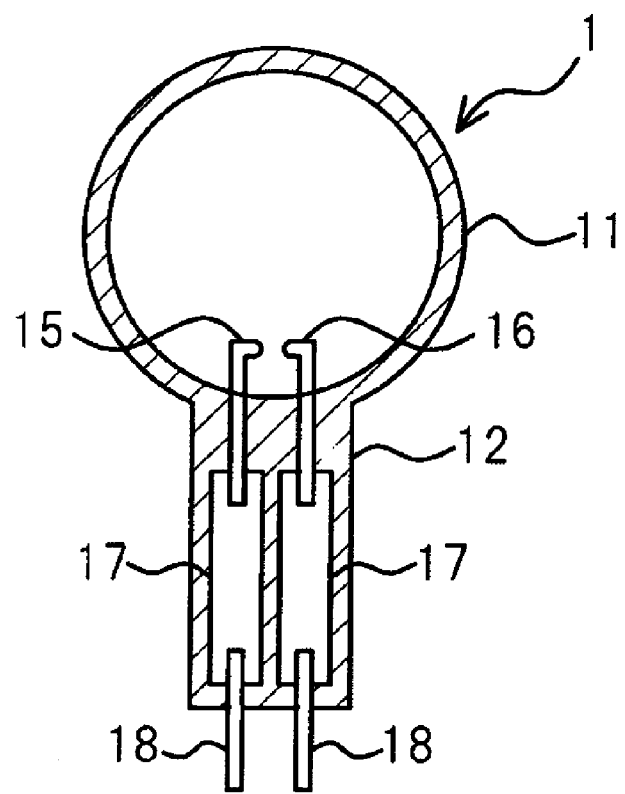
FIG. 14 is a diagram illustrating the configuration of the discharge chamber 1 in a case where, instead of the electrodeless discharge chamber shown in FIG. 12, an electrode discharge chamber is used as the discharge chamber 1 according to the first to fourth and sixth to tenth exemplary embodiments.

FIG. 14 is a diagram illustrating the configuration of the discharge chamber 1 in a case where, instead of the electrodeless discharge chamber shown in FIG. 12, a discharge chamber with electrodes is used as the discharge chamber 1 according to the first to fourth and sixth to tenth exemplary embodiments.

As shown in the drawing, the discharge chamber 1 is a discharge chamber having a pair of electrodes 15 and 16 therein. The electrodes 15 and 16 are connected to the metal foil 17 embedded in the sealing portion 12. An external lead 18 connected to the metal foil 17 is extended outward from the sealing portion 12.

In the first to fourth exemplary embodiments, a voltage for starting discharge is supplied from a power supply (not shown) to the external lead 18, and the voltage is applied between the electrodes 15 and 16. Thus, it is possible to promote excitation of the luminescent substance within the discharge chamber 1. As a result, it is also possible to reliably generate the discharge as compared with the case where only the laser light is used. Furthermore, after the stabilization of the discharge, the voltage is not applied between the electrodes 15 and 16.

In the sixth to tenth exemplary embodiments, the pulse laser light B for starting discharge is irradiated while the voltage for starting discharge is applied between the electrodes 15 and 16. Then, after irradiation of the pulse laser light B and application of the voltage are stopped, and the CW or pulse laser light A for maintaining the discharge is irradiated. Alternatively, the pulse laser light B for starting discharge is irradiated while the voltage for maintaining discharge is applied between the electrodes 15 and 16. Then, the CW or pulse laser light A for maintaining the discharge is irradiated.

Figure 15:
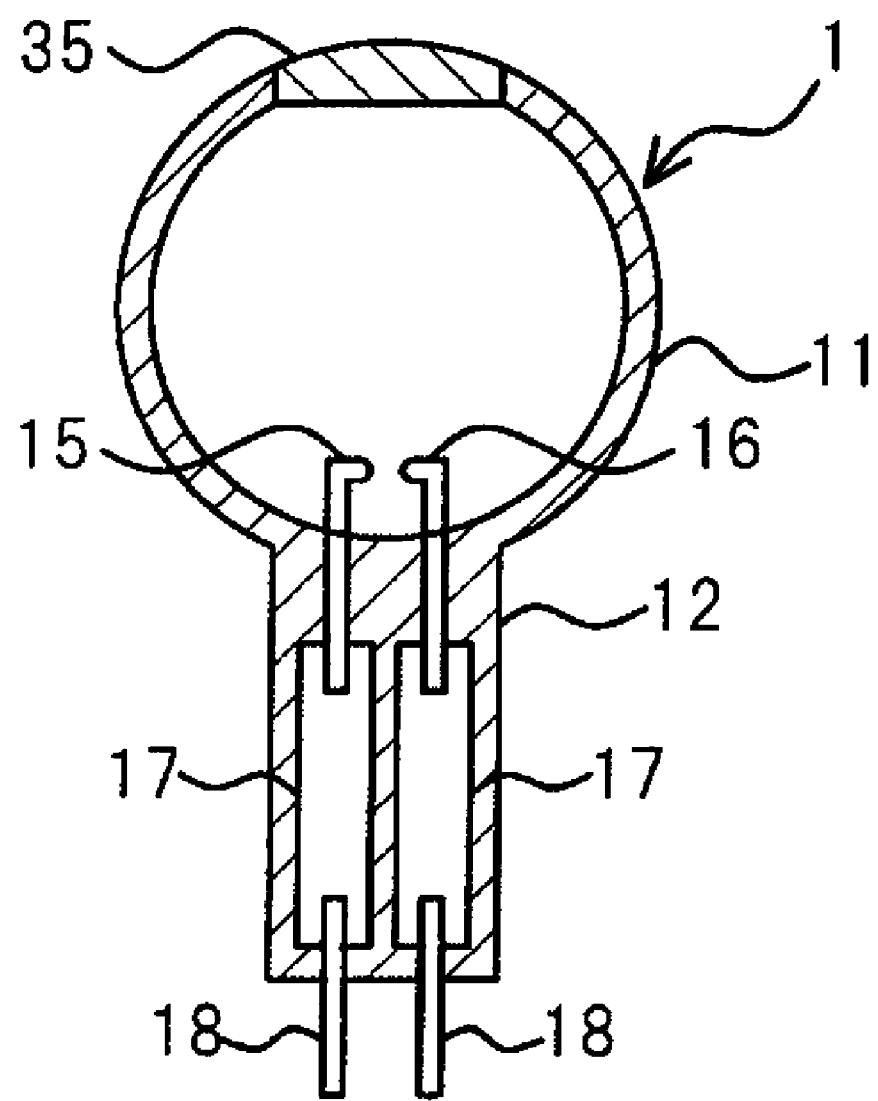
FIG. 15 is a diagram illustrating the configuration of the discharge chamber 1 in a case where, instead of the electrodeless discharge chamber shown in FIG. 13, an electrode discharge chamber is used as the discharge chamber 1 according to the fifth and eleventh exemplary embodiments.
Figure 16:
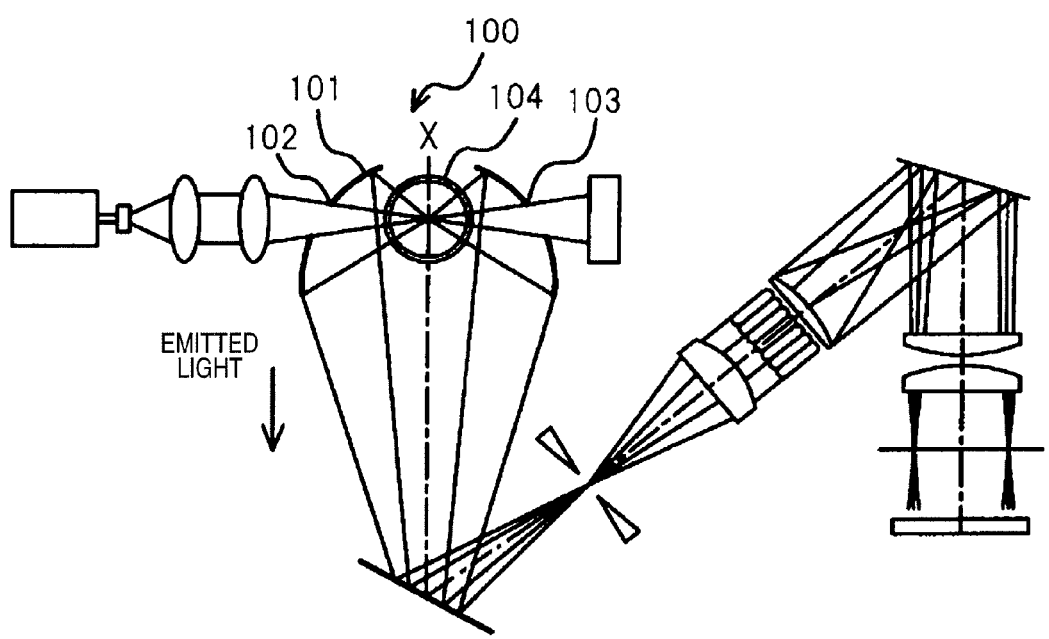
FIG. 16 is a diagram illustrating a light source disclosed in JP-A-61-193358.
Figure 17:
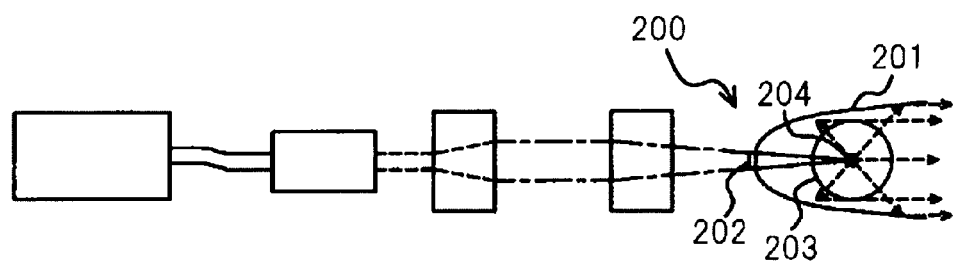
FIG. 17 is a diagram illustrating a light source disclosed in US2007/0228300.
Figure 18:
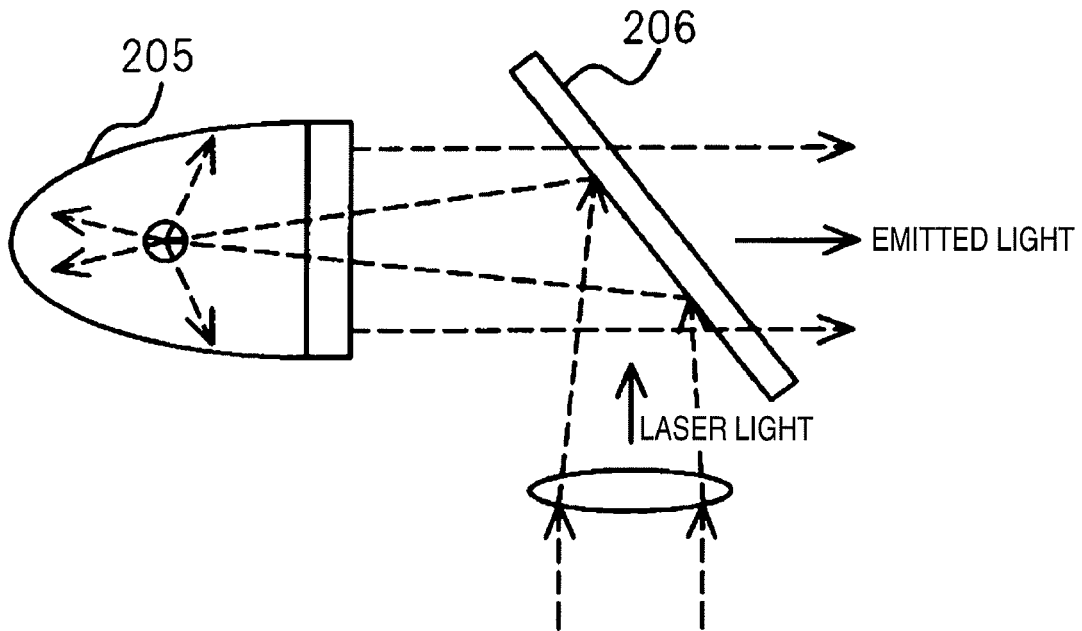
FIG. 18 is a diagram illustrating a configuration for solving problems of the light source shown in FIG. 17.
Figure 19:
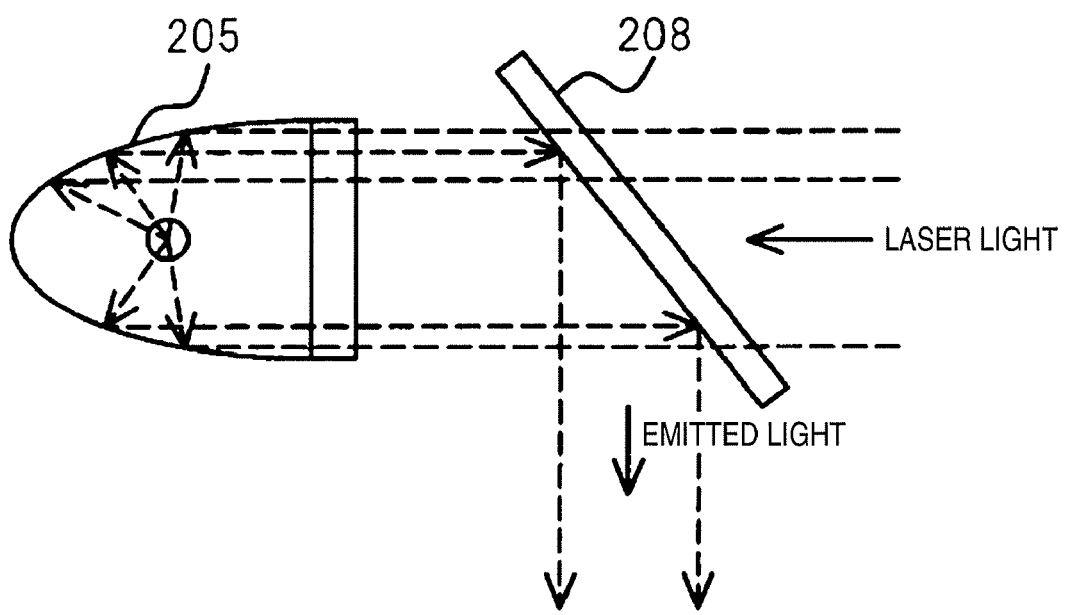
FIG. 19 is a diagram illustrating a configuration for solving problems of the light source shown in FIG. 17.

FIG. 15 is a diagram illustrating the configuration of the discharge chamber 1 in a case where, instead of the electrodeless discharge chamber shown in FIG. 13, a discharge chamber with electrodes is used as the discharge chamber 1 according to the fifth and eleventh exemplary embodiments.

As shown in the drawing, the discharge chamber 1 is provided with the collecting lens portion 35 that is formed on a portion of the discharge chamber 1 so as to collect the laser light. Further, the other configurations and advantages are the same as those of the discharge chamber 1 described in FIG. 14, and thus description thereof will be omitted herein.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:
1. A light source comprising:
an elliptical reflection mirror having first and second focal points;
a discharge chamber in which a luminescent substance is enclosed and which is disposed on the first focal point of the elliptical reflection mirror;
a laser light generator which emits the laser light; and
a laser light guide disposed between the first focal point and the second focal point of the elliptical reflection mirror and which guides the laser light from an opening side of the elliptical reflection mirror into the discharge chamber, wherein the luminescent substance is excited by providing the laser light to the luminescent substance so as to emit light, and the light is reflected by the elliptical reflection mirror, and wherein the laser light guide is disposed in an area in which the light reflected by the elliptical reflection mirror is blocked by the discharge chamber.

2. The light source according to claim 1, wherein the laser light guide comprises:
an optical fiber which guides the laser light into the discharge chamber; and
a collecting lens which is disposed between an output end of the optical fiber and the discharge chamber.

3. The light source according to claim 1, wherein the laser light guide comprises:
a reflection mirror which reflects the laser light toward the discharge chamber; and
a collecting lens which is disposed between the reflection mirror and the discharge chamber.

4. The light source according to claim 1, wherein the laser light guide is a collecting mirror that collects and reflects the laser light toward the discharge chamber.

5. The light source according to claim 1, wherein the laser light guide is a reflection mirror that reflects the laser light, which is emitted from the laser light generator and then is collected by a collecting lens, toward the discharge chamber.

6. A light source comprising:
an elliptical reflection mirror having first and second focal points;
a discharge chamber in which a luminescent substance is enclosed and which is disposed on the first focal point of the elliptical reflection mirror;
a laser light generator which emits the laser light; and
a laser light guide disposed between the first focal point and the second focal point of the elliptical reflection mirror and which guides the laser light from an opening side of the elliptical reflection mirror into the discharge chamber, wherein the luminescent substance is excited by providing the laser light to the luminescent substance so as to emit light, and the light is reflected by the elliptical reflection mirror, wherein the laser light guide is disposed in an area in which the light reflected by the elliptical reflection mirror is blocked by the discharge chamber, and wherein the laser light guide comprises:
an optical fiber that guides the laser light into the discharge chamber; and
a collecting lens portion that is formed on a portion of the discharge chamber so as to collect the laser light output from the optical fiber.

7. The light source according to claim 1, wherein the discharge chamber is an electrodeless discharge chamber having no electrode therein.

8. The light source according to claim 1, wherein the discharge chamber is an electrode discharge chamber having a pair of electrodes therein.

9. The light source according to claim 7, wherein the laser light is a pulse laser light for starting discharge and a pulse or CW laser light for maintaining discharge.

10. The light source according to claim 8, wherein the laser light, which is guided into the discharge chamber, is a pulse or CW laser light for maintaining discharge.

11. The light source according to claim 1, wherein the discharge chamber comprises a heating unit for heating the discharge chamber.

12. The light source according to claim 11, wherein the heating unit is a heating element that is embedded in the discharge chamber so as to generate heat by absorbing the laser light.

13. The light source according to claim 1, wherein the light reflected by the elliptical reflection mirror is focused on the second focal point of the elliptical reflection mirror.

\* \* \* \* \*